United States Patent [19]

Chandross et al.

[11] 4,409,318
[45] Oct. 11, 1983

[54] PHOTOSENSITIVE ELEMENT CONTAINING A POLYMER OF AN INDENONE BASED COMPOUND AND A METHACRYLATE COMPOUND

[75] Inventors: Edwin A. Chandross, Berkeley Heights; Ray L. Hartless, Lopatcong Township, Warren County, both of N.J.

[73] Assignee: Bell Telephone Laboratories, Incorporated, Murray Hill, N.J.

[21] Appl. No.: 409,408

[22] Filed: Aug. 19, 1982

Related U.S. Application Data

[62] Division of Ser. No. 259,534, May 1, 1980, Pat. No. 4,363,867.

[51] Int. Cl.³ ............................................... G03C 1/78
[52] U.S. Cl. ................................ 430/271; 204/159.22; 428/195; 428/209; 428/901; 430/272; 430/276; 430/311; 526/280; 526/283

[58] Field of Search .............. 526/280, 283; 430/270, 430/272, 271, 276, 302, 311, 313, 322, 17; 204/159.22; 428/195, 209, 901

[56] References Cited

U.S. PATENT DOCUMENTS

| 3,959,234 | 5/1976 | Kurosawa et al. | 204/159.22 |
| 4,297,433 | 10/1981 | Tsuda et al. | 430/296 |
| 4,302,529 | 11/1981 | Lai | 430/296 |
| 4,304,840 | 12/1981 | Helbert | 430/296 |

*Primary Examiner*—Jack P. Brammer
*Attorney, Agent, or Firm*—Bruce S. Schneider

[57] ABSTRACT

The use of polymers including an indanone entity for use as a resist in a photosensitive body used in a lithographic process leads to desirable results. These resists have excellent resolution essentially equivalent to that obtainable with poly(methyl methacrylate). Additionally, the sensitivities of these polymers to the actinic radiation typically used in photolithographic processes, e.g., radiation from a mercury lamp, is significantly better than that obtained with poly(methyl methacrylate).

8 Claims, No Drawings

PHOTOSENSITIVE ELEMENT CONTAINING A POLYMER OF AN INDENONE BASED COMPOUND AND A METHACRYLATE COMPOUND

This is a division of application Ser. No. 259,534 filed May 1, 1981 now U.S. Pat. No. 4,363,867.

BACKGROUND OF THE INVENTION

1. Field of the Invention

This invention relates to lithographic processes and, in particular, to lithographic processes involving device fabrication.

2. Art Background

Lithographic processes are typically employed in the manufacture of devices such as semiconductor devices. Among the lithographic processes that are available, photolithography is often utilized. Photolithographic processes have the advantage of being suitable for a blanket exposure technique. That is, a material that is sensitive to the exposing light is coated on a substrate, e.g., a silicon wafer, that is being processed to form a plurality of devices. The coating material i.e., the resist, is then subjected to light that has been passed through a mask material so that the light reaching the resist corresponds to a desired pattern that is to be transferred to the underlying substrate. Since the exposure occurs simultaneously over an entire device or a number of devices in process on a wafer, e.g., a silicon wafer, the procedure is considered a blanket exposure.

A blanket exposure procedure is advantageous because it is relatively fast compared to other methods such as the raster scan technique usually employed when the energy used to expose the resist is a beam of electrons. However, generally, resolution obtainable through a blanket exposure with ultraviolet or visible light is somewhat poorer than that achieved with other methods such as electron lithography.

One resist material, poly(methyl methacrylate) (PMMA) upon exposure with ultraviolet actinic radiation has shown resolution better than that achieved with exemplary resists used at conventional wavelengths (greater than 300 nm). For example, PMMA has been shown to be capable of resolution as good as about 2500 Angstroms. (See B. J. Lin, *Journal of Vacuum Science and Technology*, 12, 1317 (1975).) Although PMMA exhibits excellent resolution, its sensitivity to practical sources of actinic radiation is quite limited. Therefore, exposure times are generally excessive for practical applications. As a result, the attainment of excellent resolution, together with the relatively short exposure times associated with blanket exposure, is an elusive goal.

SUMMARY OF THE INVENTION

Photosensitive bodies that allow delineation of a pattern with excellent resolution and having sensitivities permitting blanket exposure rely on a substrate coated with a material chosen from a particular class of polymers. This class of polymers is formed from the reaction of monomers based on the indenone structure with monomers based on a methacrylate compound. The photosensitive bodies show excellent resolution, i.e., allow the formation of features as small as 7500 Angstroms, and also have sensitivities that permit blanket exposure in time periods substantially shorter than poly(methyl methacrylate). Thus, excellent resolution together with the attributes of relatively rapid exposure are obtainable.

These polymers generally have the structure represented by the formula

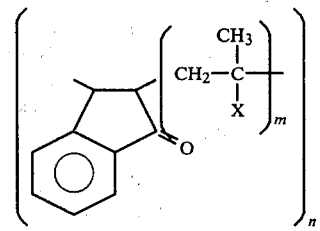

where X is a nitrile, carboxylic acid, or alkyl ester functional group.

DETAILED DESCRIPTION

Polymers incorporating the indanone structure are particularly useful as resist materials for the subject photosensitive bodies. As previously discussed these resist materials are typically coated on a substrate, e.g., a semiconductor based wafer such as a silicon wafer that is being processed to form semiconductor devices and exposed to ultraviolet radiation to delineate a pattern for a subsequent process such as an etching or metallization process. (It should be emphasized that during the processing of semiconductor wafers, it is possible to form the photosensitive body by depositing the resist on a substrate surface that includes a semiconductor material, an insulator, such as a silicon oxide, a metal, or a combination of these materials.) The coating process is conventional. Typically, the polymer is dissolved in a suitable solvent such as chlorobenzene, the solution is filtered and then placed on the wafer to be coated, and the wafer is spun. The spinning procedure distributes the solution essentially uniformly on the surface of the wafer, and also causes the evaporation of substantially all of the solvent. In this manner films in the thickness range 0.3 μm to 2 μm (representative of thicknesses employed in photolithography) are produced on an appropriate substrate material such as a silicon or GaAs wafer being processed into semiconductor devices.

The polymers used as a resist material in these coatings for substrates such as a silicon body, e.g., a silicon wafer that is being processed for production of semiconductor devices, are produced by a free radical polymerization reaction. In this polymerization reaction an indenone based monomer such as

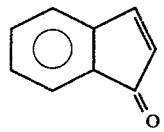

is reacted with a methacrylate compound of the formula

(1)

where X is a nitrile, an alkyl ester functional group of the form CO$_2$R, or a carboxylic acid group. If the ester grouping is employed R is preferably a methyl substituent. Other homologs for the ester function group are not precluded. However, the higher the molecular weight of the R substituent, the lower the glass transition temperature of the resulting polymer, in general, and the greater the tendency of the patterned resists or deform. Additionally, substitution on the benzene ring of the indanone moiety with substituents such as Cl, F, Lower alkoxy, e.g., methoxy, and alkyls, e.g., t-butyl, is employable. The substituent employed is not critical. However, strongly electron donating groups such as amines or strongly electron acceptor groups such as carboxylic acids are generally not desirable since they generally change the electronic states of the indanone polymer moiety sufficiently to interfere with chain cleavage upon irradiation. Further, if substituents having H atoms α to the benzene ring are employed and the reaction pathway to form the indenone monomer employing bromination (as described below) is utilized, conventional precautions such as reaction in the dark should be employed to prevent substitution of the α-H by bromine.

Polymerization is done by conventional techniques. (See *Preparative Methods of Polymer Chemistry* by Wayne R. Sorenson and Tod W. Campbell, 2nd Ed. Interscience, 1968, Ch 4.) However, since indenone is not a particularly stable compound, it is desirable to form this material in situ immediately before the polymerization reaction from a storable precursor. In a preferred embodiment, this in situ formation is done by decomposing 1,1-spirodioxolane-2,3-indene (SPI). This decomposition to indenone is induced simply by introducing the SPI into an acidic solution containing several, e.g., 2 to 10 mole equivalents of water. Copolymerization of the methacrylate compound and the indenone is then preferably performed by adding a polymerization initiator, such as benzoyl peroxide, to the solution of the hydrolyzed SPI and the methacrylate monomer. The desired polymerization is induced by heating the mixture in the temperature range of 55 to 80 degrees C.

The synthesis of SPI has been described by H. O. House et al, *Journal of the American Chemical Society*, 82, 1452 (1960). It is possible to modify the House synthesis to improve the yield. In accordance with this improved procedure indanone is brominated in ether solution at −5 degrees C. using slightly less than an equivalent of bromine, i.e., less than 1 mole. (Less than stoichiometric quantities of bromine are utilized to reduce the possibility of dibromination.) Additionally a catalytic quantity, i.e., approximately 0.1 ml of hydrobromic acid is added to initiate the bromination reaction.

The resulting bromoindanone is recovered after evaporation of the ether. The bromoindanone is reacted with ethylene glycol in benzene solution containing a catalyst such as toluenesulfonic acid. Water produced in the reaction is continuously removed. The 1,1-spirodioxolane-2-bromoindane (SPD) solution thus formed is then washed with water to remove any excess ethylene glycol. After drying the solution with sodium sulfate, the benzene is removed using conventional techniques such as rotary evaporation with a vacuum produced from a water aspirator. The SPD is then dehydrobrominated using a conventional strong base, such as sodium ethoxide, potassium t-butoxide, or sodium hydroxide. The base is conveniently introduced in a solution such as an ethanol solution for sodium ethoxide and sodium hydroxide, or t-butyl alcohol solution for potassium t-butoxide. This procedure results in the desired SPI.

The synthetic route to producing the desired polymer

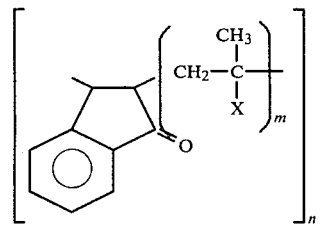

is schematically represented by the reaction chain

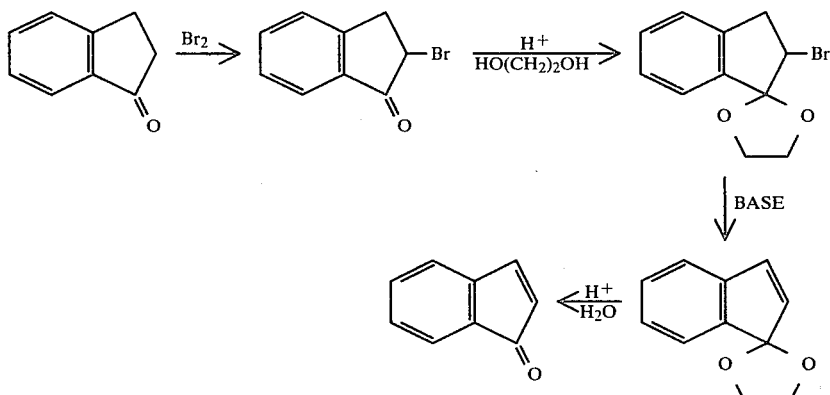

-continued

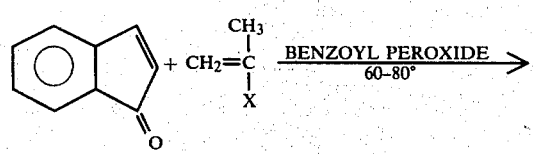 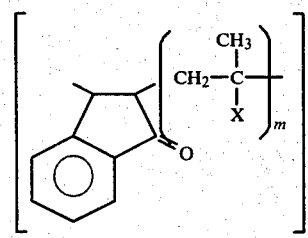

The polymer produced should preferably have a glass transition temperature, $T_g$, that is higher than 75 degrees C., preferably higher than 105 degrees C. If the $T_g$ is substantially lower than the given limit there is a tendency for pattern deformation to occur at typical processing temperatures and, thus, there is a possibility of obtaining degraded resolution. In this regard, as previously discussed, the smaller the R of the $CO_2R$ group in formula (1) the higher the $T_g$. Although a $T_g$ below 75 degrees C. is not precluded, it is generally desirable to employ an X which yields a $T_g$ of at least this magnitude. Additionally the material should form an essentially pinhole free, continuous coating on the substrate to be treated. For example, in the case of a silicon based substrate, such as a processed silicon device wafer, the subject polymers form excellent coatings. Typically, the thickness of the polymer coating utilized is in the range 0.3 $\mu$m to 2 $\mu$m, preferably 0.3 $\mu$m to 1 $\mu$m. Thinner coatings are difficult to maintain pinhole free, and thicker coatings are unnecessarily expensive. Additionally, in thicker coatings the resolution is generally inferior since the delineation of narrow features results in the production of narrow columns in the developed pattern that tend to deform.

An appropriate optical density for the resist coating in the wavelength range to be used for exposure significantly enhances resist quality. Too low an optical density results in inefficient absorption of the exposing radiation and in unnecessarily long exposure times. Too high an optical density does not permit sufficient light to reach the regions of the polymer film furthest removed from its surface. This incomplete exposure tends to degrade resist image quality. In general, it is desirable to employ an optical density that is preferably less than 0.5 for at least 80% of the actinic radiation that reaches the polymer in the wavelength range between 200 nm and 300 nm.

The optical density varies linearly with the polymer thickness. The optical density also depends on the amount of indenone included in the polymer as indanone moieties. Generally, the amount of inclusion is approximately twice the mole fraction of that in the initial monomer reaction mixture. Thus, once a suitable thickness is chosen the polymer composition is adjusted to provide the desired optical density. For thicknesses as previously discussed in connection with film continuity, indanone mole percent in the final polymer should be in the range 1 to 20 mole percent, preferably 2 to 15 mole percent.

It is contemplated that the subject polymers undergo a chain scission upon exposure to short wavelength ultraviolet light, i.e., light in wavelength range from 200 to 300 nm. Since typical light sources such as a mercury lamp have useful intensity in the wavelength region between 230 nm and 300 nm, such sources are useful for exposing the subject resist materials. Once the resist material is exposed, the exposed portion has a different solubility from those portions that were not subjected to actinic radiation. Generally a solvent is employed to develop the exposed material that preferentially dissolves the exposed portion and leaves the unexposed portion of the resist material essentially untouched. For polymers containing nitrile or esters of the methacrylate based monomer, organic solvents such as amyl acetate, methyl isobutyl ketone, methyl isobutyl ketone with dissolved water, and mixtures of isopropyl alcohol with methyl isobutyl ketone, are suitable for development. For polymers formed from acid analogs of the methacrylate monomer an aqueous alkaline solution is preferably used. This aqueous alkaline solution in the preferred embodiment includes sodium bicarbonate in combination with an alcohol such as isopropyl alcohol. After the photosensitive body is developed, the resulting pattern is useful as an etch mask or for other conventional processing steps utilizing a delineated resist pattern. When desired, the delineated resist is removed with a suitable solvent stripper such as chlorobenzene.

It should be noted that the use of an indenone monomer and methacrylate analog to form the polymer does not exhaust the useful polymers employed in the photosensitive bodies of this invention. It is possible to add other monomers or additives, into the polymerization mixture to modify certain properties of the polymer. However, the mole percentage of indenone included in the final polymer should be generally greater than 1% and less than 20%. If fewer indanone groups are present, insufficient chain scission upon exposure to actinic radiation occurs and sensitivity is relatively low. If more indenone is incorporated, the resist films tend to crack, and the optical density is excessive.

The resolution and sensitivity obtained depend on the average molecular weight (defined by Billmeyer, *Textbook of Polymer Science*, page 6, 1971, J. Wiley & Sons) of the polymer, the distribution of the molecular weight, and the relative proportions of the monomers in the polymer. For relatively high sensitivities, it is generally desirable to employ polymers with molecular weights greater than 50,000, preferably greater than 100,000, and dispersivities below 3.5, preferably below 2.5. (Dispersivities are defined in Billmeyer, Supra, page 6.) Molecular weights, however, that are larger than 2,000,000 are typically not desirable because the resulting polymer solution used in coating is excessively viscous.

The molecular weight of the polymer is determined by the polymerization reaction temperature, the catalyst, if any, the catalyst concentration, as well as the concentrations of the monomers that are utilized. These parameters are interrelated and a control sample is utilized to determine the specific conditions necessary to yield a desired molecular weight. However, generally for molecular weight in the desired range, temperature in the range 55 to 80 degrees C., with free radical initiators such as benzoyl peroxide in a concentration range from 0 to $10^{-3}$ M, and monomers of indenone compounds (or its precursor such as SPI) and methacrylate compounds having concentrations in the range 0.2 to 5 weight per volume percent, and 10 to 50 weight per volume percent, respectively, in the reaction mixture are employed.

Dispersivity is predominantly dependent on the reaction temperature, the catalyst, if any, and the percentage of the monomers converted into the polymer. To obtain dispersivities in the desired range, the parameter ranges previously discussed in the context of molecular weight reaction temperatures in the range 55 to 80 degrees C. and reaction times in the range 6 to 20 hours typically are employed. A control sample is used to determine the precise conditions needed for a particular desired dispersivity.

Sensitivity also depends on the relative proportions of the monomers incorporated into the polymer. This proportion is essentially equal to the ratio of twice the moles of the indenone monomer used in the reaction mixture to the moles of methacrylate compound employed. Generally, to attain a desirable sensitivity and resolution the mole percent in the final polymer of indenone compound should be in the range 1 to 20 mole percent, preferably 2 to 15 mole percent, with the remainder being methacrylate compound. (The addition of other monomers to the two monomers used to form the copolymer is possible. However, the percentage range of the indenone monomer should not be altered.)

The following examples are illustrative of the conditions employed to produce the inventive photosensitized bodies and to delineate patterns in them:

EXAMPLE 1

Approximately 30 g of methyl methacrylate, 1 g of 1,1-spirodioxolane-2,3-indene, 1 ml of water, and 40 ml of ethyl acetate were combined. The mixture was heated to 60 degrees C. and was deoxygenated by bubbling nitrogen through it for approximately 5 minutes. After deoxygenation, approximately 3 mg of toluenesulfonic acid hydrate was added. After approximately 20 minutes at 60 degrees C., the solution was deep yellow. At a point 30 minutes after the addition of the toluenesulfonic acid hydrate, 5 mg of benzoyl peroxide was added. The solution was then maintained at 60 degrees C. for 15 hours under nitrogen with continuous stirring. After the 15 hours had elapsed, the reaction mixture was added to an approximately four fold volume of methanol that caused the polymer to precipitate. The polymer was then separated from the liquid by filtration. The polymer was dissolved in approximately 200 ml of methylene chloride. The methylene chloride was added dropwise to approximately 800 ml of methanol to reprecipitate the polymer and the polymer was separated by filtration. This dissolution, reprecipitation, and filtration was performed two more times. The polymer was again separated and dried under vacuum at 50 degrees C. to a constant weight. The relative concentration of indenone to methyl methacrylate in the copolymer was determined by UV spectroscopy to be approximately twice the relative concentrations in the reaction mixture. Molecular weights and dispersivities of polymers having various indenone contents produced as described above by using an approximate concentration of indenone in the reaction mixture to yield the desired mole percentage of indanone groups in the final polymer are shown in the following table:

TABLE

| | Resist Parameters | | | | |
|---|---|---|---|---|---|
| Indenone Content | Film Optical Density at 280nm | Exposure required (J/cm$^2$) at 280nm | $M_w \times 10^{-5}$ | $T_g$ | $M_w/M_n$ |
| 3% | 0.03 | 0.6 | 4.9 | 122 | 2.12 |
| 7% | 0.07 | 0.2 | 0.73 | 126 | 1.60 |
| 18% | 0.16 at 248nm | 0.1 at 248nm | 1.6 | 132 | 1.85 |
| 3% | 0.22 | 0.06 | 4.9 | 122 | 2.12 |
| 7% | 0.53 | 0.02–0.06 | 0.73 | 126 | 1.60 |
| 18% | 1.1 | 0.13 | 1.6 | 132 | 1.85 |
| PMMA | 0.7 J/cm$^2$ | (literature) | | | |

$M_w/M_n$ = dispersivity

Molecular weights and dispersivities in the table were determined by gel permeation chromatography. Glass transition temperatures were determined by differential scanning calorimetry. Optical spectra and densities were determined by spinning a resist film on a quartz disk as described in Example 2 and measuring its absorption spectrum with a conventional double beam spectrophotometer.

EXAMPLE 2

Films of the indenone copolymer shown in the table were prepared on a silicon substrate (3 inch diameter) by first dissolving sufficient polymer in chlorobenzene to produce an approximately 5% by weight solution. Approximately 0.5 ml of the solution were placed on the wafer and the wafer was spun for 60 seconds at 4000 rpms. The result was a film having a thickness of approximately 6500 Angstroms covering the entire surface of the wafer. The coated substrates were heated at 150 degrees C. in air for approximately 60 minutes. The substrates were then exposed through a mask contacting the substrate. The mask had a 1 mm circular opening. Essentially monochromatic light at one of the wavelengths specified in the table was isolated using a grating monochromator and a 1000 watt mercury lamp. The light from the monochromator was focussed onto the mask. Various portions of the wafer were exposed through the mask using different irradiation times for each exposure. (Incident light intensity was measured with a calibrated thermopile.) The film was developed by immersing the wafer for 1 minute in a solution of methyl isobutyl ketone saturated with water. The energy dosage for the shortest exposure necessary to allow removal of the entire thickness of the film in the exposed circular region was taken as the sensitivity. These sensitivities as determined by this method are given in the table.

EXAMPLE 3

The resist coated wafers as described in Example 2, were exposed with a Perkin-Elmer Model 111 projection printer. The light source for this printer was modified by using a dichroic mirror that enabled exposures to be made with a mercury arc source at wavelengths as short as 280 nm. A test mask with openings and spaces between the openings varying from 0.5 to 2.5 μm was employed. The wafers were then exposed and developed as in Example 2. The resolution of the resist material was taken to be the narrowest line that was delineated from its neighbor. Generally, resolutions on the order of 0.75 μm were obtained.

EXAMPLE 4

The procedure of Example 1 was followed except the reaction mixture was composed of 20 g of distilled methyl methacrylate, 4.3 g of methacrylic acid, 1.3 g of SPI, 1 ml of water, and 45 ml of methyl acetate. The reaction mixture was heated to 68 degrees C. The resulting polynmer was separated as described in Example 1, except that the polymer was dissolved in acetone and precipitated by addition of this acetone solution to hexane. Films were prepared on a silicon substrate as described in Example 2. The resist films were heated to approximately 150 degrees C. for approximately 1 hour. The resists were then tested for resolution as described in Example 3. The films were developed for 2 minutes in a solution containing 3 g of sodium bicarbonate, 100 ml of water, and 25 ml of 2-propanol. The resolution was approximately 0.75 μm.

What is claimed is:

1. A photosensitive body comprising a substrate in contact with a photosensitive material, said photosensitive material comprising an organic polymer characterized in that said polymer is formed from the monomers comprising (1) an indenone based compound represented by the formula

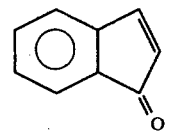

and (2) a methacrylate compound represented by the formula

where X is chosen from the group consisting of nitriles, alkyl esters, and carboxylic acid functional groups.

2. The photosensitive body of claim 1 wherein said substrate comprises a semiconductor material.

3. The photosensitive body of claim 2 wherein said semiconductor material comprises silicon.

4. The photosensitive body of claim 2 wherein the surface of said substrate includes a member of the group consisting of semiconductor materials, insulators, metals, and combinations thereof.

5. The photosensitive body of claim 1 wherein said polymer has a molecular weight in the range 50,000 to 2,000,000.

6. The photosensitive body of claim 5 wherein said molecular weight is in the range 100,000 to 2,000,000.

7. The photosensitive body of claim 1 wherein said indenone compound is substituted on the benzene ring.

8. The photosensitive body of claim 1 wherein said indenone compound comprises 1 to 20 mole percent of said polymer.

* * * * *

UNITED STATES PATENT AND TRADEMARK OFFICE
CERTIFICATE OF CORRECTION

PATENT NO. : 4,409,318

DATED : October 11, 1983

INVENTOR(S) : Edwin A. Chandross and Ray L. Hartless

It is certified that error appears in the above—identified patent and that said Letters Patent is hereby corrected as shown below:

Column 3, line 8, "resists or" should read --resists to--. Column 3, line 10, "C1" should read --Cl--. Column 7, line 65, "approximate" should read --appropriate--. Column 9, line 11, "polynmer" should read --polymer--.

Signed and Sealed this

Thirty-first Day of July 1984

[SEAL]

Attest:

GERALD J. MOSSINGHOFF

Attesting Officer

Commissioner of Patents and Trademarks